(12) United States Patent
Gerstel et al.

(10) Patent No.: US 8,914,711 B2
(45) Date of Patent: *Dec. 16, 2014

(54) VARIABLE FORWARD ERROR CORRECTION FOR OPTICAL COMMUNICATION LINKS

(75) Inventors: Ornan Gerstel, Los Altos, CA (US); Loukas Paraschis, Palo Alto, CA (US); Peter Lothberg, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 493 days.

This patent is subject to a terminal disclaimer.

(21) Appl. No.: 12/932,948

(22) Filed: Mar. 10, 2011

(65) Prior Publication Data

US 2011/0167314 A1    Jul. 7, 2011

Related U.S. Application Data

(63) Continuation of application No. 11/786,696, filed on Apr. 12, 2007, now Pat. No. 7,930,616.

(51) Int. Cl.
*H03M 13/00* (2006.01)
*H03M 13/35* (2006.01)
*H03M 13/15* (2006.01)

(52) U.S. Cl.
CPC ........ *H03M 13/353* (2013.01); *H03M 13/1515* (2013.01); *H03M 13/15* (2013.01)
USPC ........................................................ 714/776

(58) Field of Classification Search
CPC ... H04L 1/0057; H04L 1/0061; H04L 1/0041; H04L 1/0083; H04L 1/0072
USPC ........................................................ 714/776
See application file for complete search history.

(56) References Cited

U.S. PATENT DOCUMENTS

| | | | |
|---|---|---|---|
| 5,511,079 A * | 4/1996 | Dillon ........................... | 714/774 |
| 7,388,923 B2 * | 6/2008 | Fukuta et al. ................. | 375/260 |
| 7,447,977 B2 * | 11/2008 | Bauer et al. ................... | 714/774 |
| 7,539,775 B2 | 5/2009 | Rikitake et al. | |
| 7,676,733 B2 * | 3/2010 | Ganga et al. .................. | 714/775 |
| 7,716,560 B1 * | 5/2010 | Sprague et al. ............... | 714/776 |
| 7,746,855 B1 | 6/2010 | Bendak et al. | |
| 2002/0104053 A1 | 8/2002 | Lei et al. | |
| 2003/0169470 A1 * | 9/2003 | Alagar et al. ................. | 359/110 |
| 2005/0138524 A1 * | 6/2005 | Cioffi ............................ | 714/758 |
| 2008/0134005 A1 * | 6/2008 | Izzat et al. .................... | 714/774 |
| 2011/0003608 A1 | 1/2011 | Forenza et al. | |

OTHER PUBLICATIONS

"An overview of ITU-T G.709", Agilent Technologies, Sep. 1, 2001.

* cited by examiner

*Primary Examiner* — Albert Decady
*Assistant Examiner* — Enam Ahmed
(74) *Attorney, Agent, or Firm* — Cindy Kaplan

(57) ABSTRACT

A method and system for setting a variable forward error correction overhead in an optical transport network frame for an optical link at a node are disclosed. In one embodiment, a method includes selecting a forward error correction overhead, signaling an optical node the selected forward error correction overhead, and setting the forward error correction overhead in the optical network transport frame for use in transmission of data over the optical link. In one embodiment, the forward error correction overhead is complementary to the data payload to maintain total transmission rate.

18 Claims, 7 Drawing Sheets

| FEC OH % | 4.2 | 7 RS | 7-EFEC | 10 | 15 | 25 |
|---|---|---|---|---|---|---|
| Min Pre-FEC BER | TBD | 10-6 | 10-4 | TBD | TBD | 9 x 10-1 |
| Max Post-FEC BER | 10-15 | 10-15 | 10-15 | 10-15 | 10-15 | 10-15 |
| Margin | 0 | ~ 0.3 dB | ~ 0.5 dB | 0 | 0 | 0 |

VARIABLE FORWARD ERROR CORRECTION FOR OPTICAL COMMUNICATION LINKS

RELATED APPLICATION

This patent application is a continuation of U.S. patent application Ser. No. 11/786,696, filed Apr. 12, 2007, which is incorporated herein by reference in its entirety.

BACKGROUND

The present disclosure relates generally to Forward Error Correction (FEC) in optical communication links.

Optical communication system performance is generally limited by OSNR (Optical Signal to Noise Ratio) in WDM (Wave Division Multiplexing) systems. OSNR increases proportionally to the transmitted line rate, to the distance (and to use of optical amplification). Forward error correction has been leveraged to improve optical system performance. FEC provides additional coded data to enable error checking and correction of the digital data by a receiving device. Since FEC is based on electronics, it has a significantly lower cost as compared to optical mitigation techniques and is commonly employed in WDM systems. ITU recommendation G.709 ("Interface for the Optical Transport Network (OTN))" is an example of a framing structure which includes an FEC block. Conventional implementations based on this standard apply a fixed FEC overhead on top of a fixed 10 Gb/s payload (OC192/STM64 or 10GE) to obtain 6.2 dB of OSNR gain using a Reed-Solomon code for forward error correction, for example.

Implementations which use different FEC codes may provide additional OSNR gain, however, they are still limited by the fixed FEC and payload frame structure.

BRIEF DESCRIPTION OF THE DRAWINGS

FIG. 3 is an example of a look-up table for use in the variable FEC system.

Corresponding reference characters indicate corresponding parts throughout the several views of the drawings.

DESCRIPTION OF EXAMPLE EMBODIMENTS

Overview

Figure 1:
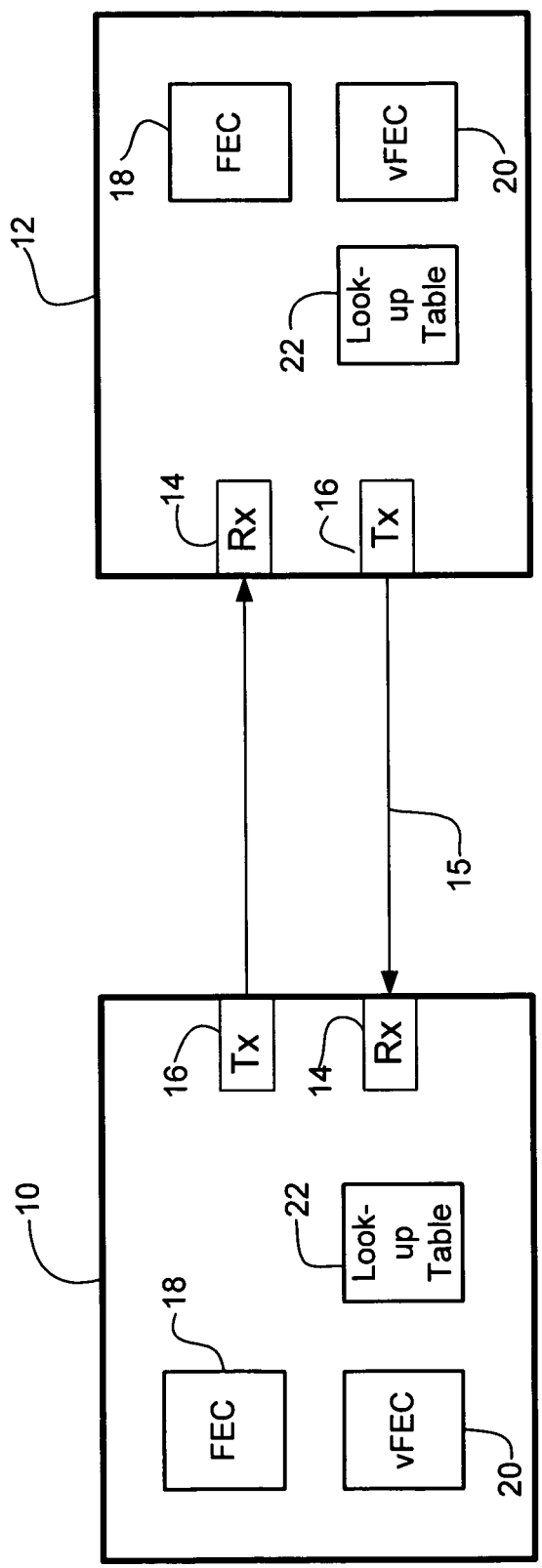
FIG. 1 illustrates an example of network elements in which embodiments described herein may be implemented.

A method and system for setting a variable forward error correction overhead in an optical transport network frame for an optical link at a node are disclosed. In one embodiment, a method generally comprises selecting a forward error correction overhead, signaling an optical node the selected forward error correction overhead, and setting the forward error correction overhead in the optical network transport frame for use in transmission of data over the optical link.

In one embodiment, an apparatus for setting the variable forward error correction overhead generally comprises a variable forward error correction device configured to select a forward error correction overhead in an optical network transport frame for use in transmission of data over the optical link, and a transmitter operable to signal an optical node said selected forward error correction overhead. In one embodiment, the forward error correction overhead is complementary to the data payload to maintain total transmission rate.

Example Embodiments

The following description is presented to enable one of ordinary skill in the art to make and use the invention. Descriptions of specific embodiments and applications are provided only as examples and various modifications will be readily apparent to those skilled in the art. The general principles described herein may be applied to other embodiments and applications without departing from the scope of the invention. Thus, the present invention is not to be limited to the embodiments shown, but is to be accorded the widest scope consistent with the principles and features described herein. For purpose of clarity, details relating to technical material that is known in the technical fields related to the invention have not been described in detail.

A method and system described herein provide a variable forward error correction (FEC) which can be adjusted to meet system OSNR (Optical Signal to Noise Ratio) performance requirements. In one embodiment, the FEC and payload portions of an optical transport unit (OTU) frame are adjusted while maintaining a fixed transmission rate. The variable FEC may be adjusted based on link impairment to maximize, data payload optical transmission distance without the need for regeneration for each link. For example, FEC may be increased to lower OSNR requirements, thereby improving transmission distance or system margin.

The embodiments described herein operate in the context of a data communication network including multiple network elements. The network may be, for example, a packet based optical network that uses speeds of 10 Gb/s (or above or below 10 Gb/s) over WDM (Wave Division Multiplexing). However, it is to be understood that the system may be used with media types different than those described herein, without departing from the scope of the invention. A network element may be, for example, a packet terminal multiplexer, an add-drop multiplexer (ADM), an optical crossconnect (OXC), a signal regenerator, router, switch, or other optical node interface.

Referring now to the drawings, and first to FIG. 1, an example of network elements 10, 12 that may implement embodiments described herein is shown. Each node 10, 12 includes a receiver 14 and a transmitter 16. The optical receiver may terminate an optical communication link such as defined by a selected wavelength of a WDM communication link 15. In one embodiment, the selected wavelength is modulated with a 10 Gb/s or 40 Gb/s signal. An optical signal is input to a photodetector that incorporates a photodiode (not shown). The output of the photodetector is an analog signal that is input to an analog to digital converter (not shown). The optical receiver includes a decoder for forward error correction (FEC) codes. The forward error correction block 18 decodes the digital data output by the analog to digital converter in accordance with an error correcting code applied at the transmit end. The output of forward error correction block 18 is decoded data. The decoding process is performed on successive codewords. Within each codeword certain bit positions are allocated to data while other bits provide redundant information for the purpose of detecting and correcting errors in the data bits. Thus, certain data bits will be left untouched by the error correction process while others will have their values changed based on the contents of the redundant information.

As described in detail below, the system includes a variable FEC device 20 configured to adaptively adjust the FEC overhead to meet OSNR performance requirements for the system and thus enable optical fiber communication links with improved transmission distance or OSNR performance. In one embodiment, the variable FEC overhead is complementary to available payload so that the total line rate remains fixed (in order to best accommodate current receiver and transmitter design needs). In another embodiment, the system does not need to maintain a fixed line rate and only the FEC overhead is adjusted, while the payload remains constant. In one embodiment, the FEC overhead is selected based on impairment characteristics of each link under consideration and a look-up table 22 containing BER (Bit Error Rate) limits is used to select the appropriate FEC setting.

Figure 2A:
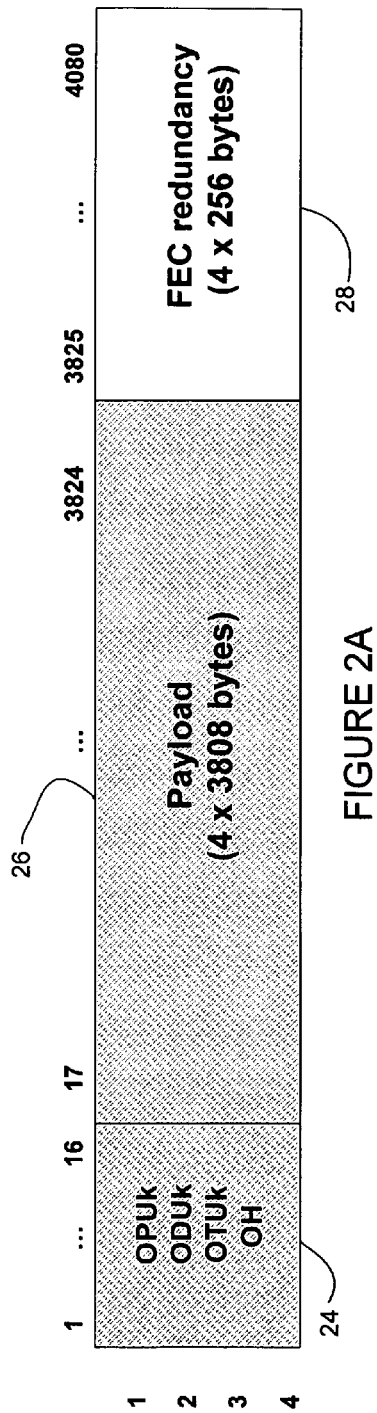
FIG. 2A illustrates frame details for 7% overhead for a variable FEC system.

FIG. 2A illustrates the three parts of the OTN (optical transport network) frame; overhead area 24 for operation, administration, and maintenance (OAM), payload area 26 for customer data, and FEC overhead 28. The OAM overhead includes the Optical Transport Unit (OTU), Optical Data Unit (ODU), and Optical Payload Unit (OPU). Each row in the frame contains 16 FEC blocks of 16 bytes for the row, thus making 64 FEC blocks (4×16) for every OTU frame. The size of the frame is four rows of 4080 bytes. Data is transmitted serially beginning at the top left, first row, followed by the second row and so on. FIG. 2A illustrates the standard ITU-T G.709 frame format which uses a 7.09% overhead.

Figure 2B:
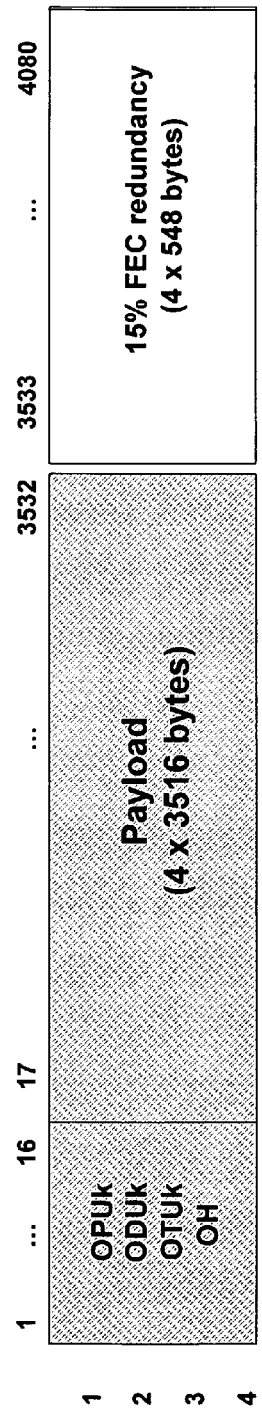
FIG. 2B illustrates frame details for 15% overhead for the variable FEC system.
Figure 2C:
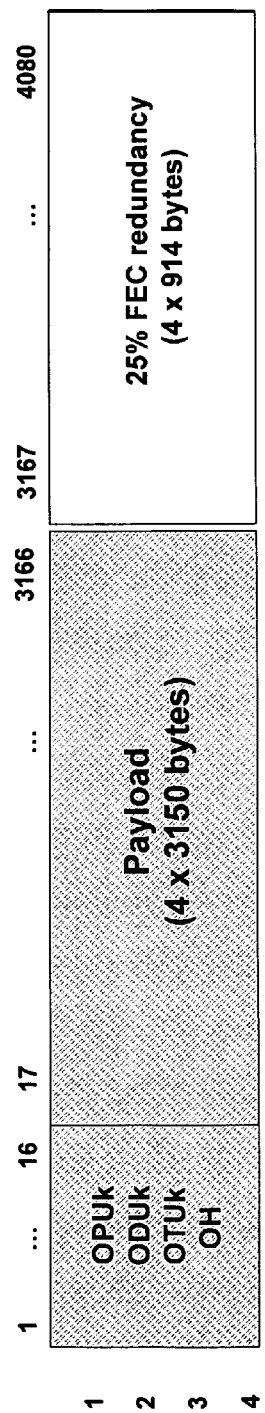
FIG. 2C illustrates frame details for 25% overhead for the variable FEC system

FIGS. 2B and 2C illustrate examples of framing structures that may be used for the variable FEC system with a variable payload and fixed transmission rate. The frame is flexible at the OTU level to accommodate the variable FEC and complementary payload. FIG. 2B illustrates a 15% FEC overhead and FIG. 2C illustrates a 25% FEC overhead. In these examples, the payload is adjusted to maintain the ITU-T G.709 constant line rate and overall frame size. For example, the total frame size for all three frames shown in FIGS. 2A, 2B, and 2C is 16320 bytes (4080×4) and the 10G line rate is 10,709.54 Mb/s. However, the payload is changed from 15232 bytes for the ITU-T G.709 standard of FIG. 2A to 14064 bytes in FIG. 2B and 12600 bytes in FIG. 2C. Similarly, the FEC is adjusted to 2192 bytes in FIG. 2B and 3656 bytes in FIG. 2C.

The FEC overhead and payload are adaptive in that the optimal amounts are determined based on the impairment characteristics of each specific link under consideration. In one example, a fixed 43 Gb/s communication link operates in default mode with an OTU-3 (40 Gb/s) payload and a 7.09% FEC overhead. For extensively impaired links, the FEC overhead can be increased, for example, to a 25% FEC overhead allowing for an additional OSNR gain (e.g., 2 dB), while the payload is reduced to 34 Gb/s. Alternatively, links with very little impairment can increase the payload above the OTU-3 levels at the expense of the unnecessary FEC overhead.

In an alternative embodiment, the variable FEC does not need to associate with a fixed total line rate. This embodiment may be used in systems that allow for an increase in transmitter and receiver line rates without significant penalties. FEC overhead can be increased proportionally to the link impairment levels without decreased payload data rates. Decreased payload data rates may be used for highly impaired links in which further increase in FEC overhead would provide no practical benefit (or corresponding OSNR gains).

The FEC scheme used in the ITU-T G.709 standard is a Reed-Solomon RS(255,239) code. For every 239 bytes of data, an additional 16 bytes (255−239=16) of data is added for error correction. The RS code produces redundant information that gets concatenated with the signal to be transmitted. This additional information is used on the receive interface to help identify and correct transmission errors. Other codes may be used for the FEC. For example, concatenated RS-RS may be used to provide a higher coding gain (e.g., 7.1 dB, as compared to 6.2 dB for 7.09% overhead). It is to be understood that the framing structures described above and the codes described herein are only provided as examples and that different percentages of FEC or payload area, or different FEC codes may be used without departing from the scope of the invention.

The frame structure (e.g., FEC, or FEC and payload size) may be selected during an initial link performance evaluation or during a trial and error convergence (negotiation) process. The variable FEC may also be set by a network operator or a default value may be used. In one example, the link impairment determination uses a BER (Bit Error Rate) estimator typically available in FEC chips.

In one embodiment, a look-up table such as shown in FIG. 3 is used to select an FEC overhead based on the pre-FEC bit error rate. The look-up table is computed based on FEC chip performance. The FEC overhead is a function of pre-FEC BER and post-FEC BER target. The table includes a minimum pre-FEC BER, which may be user defined or set to a default value (e.g., 10E-4). A margin may be added to account for BER dynamics. The table also includes a post-FEC target, which may be user defined or set to a default value (e.g., 10E-15). In the example shown in FIG. 3, minimum pre-FEC BER, maximum post-FEC BER, and margin are listed for a number of different FEC overhead percentages (4.2%, 7%, 10%, 15%, 25%). The 7% FEC is listed for Reed-Solomon code and Enhanced FEC (EFEC). It is to be understood that any number of FEC overheads or FEC codes may be included in the table. The pre-FEC BER is measured at the receiver and the FEC overhead is selected to achieve a post-FEC BER listed in the table, as described below.

Figure 4:
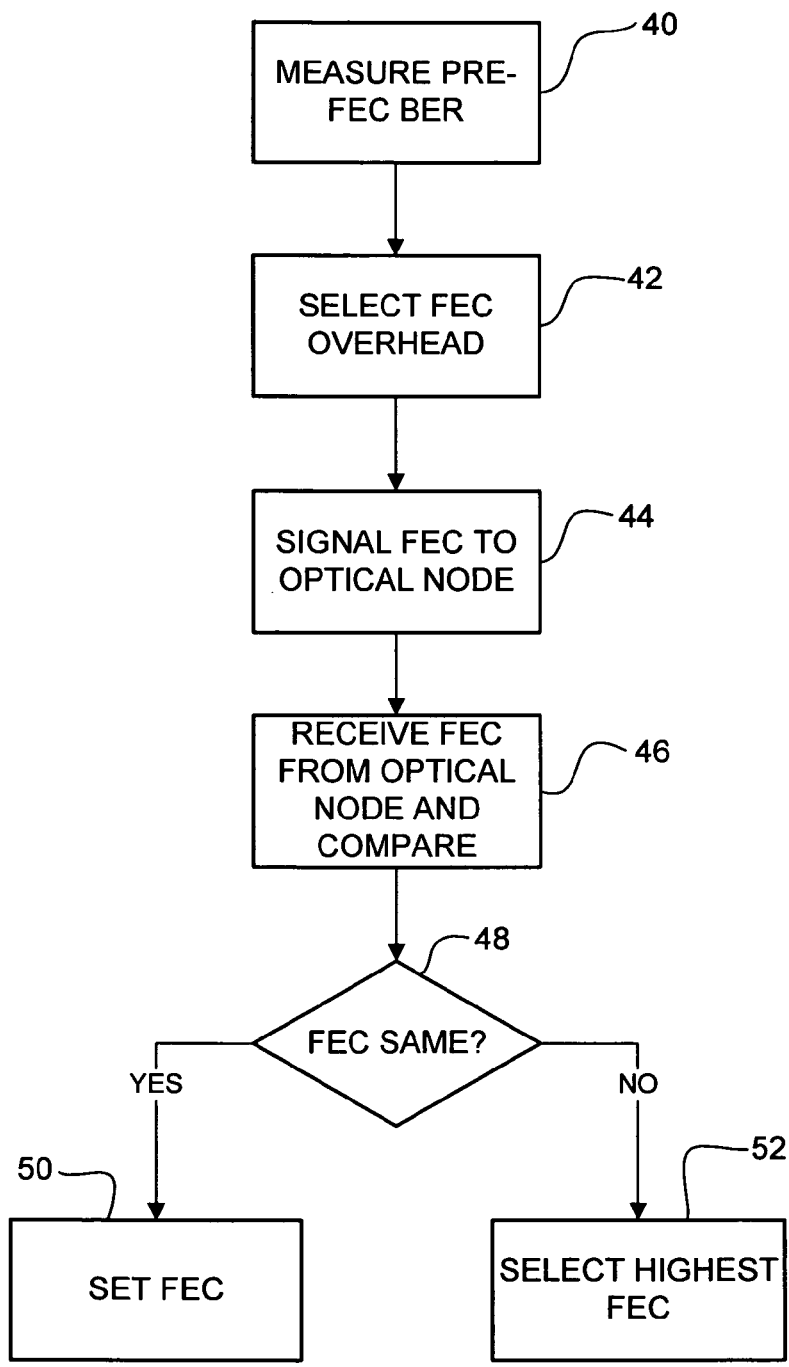
FIG. 4 is a flowchart illustrating a process for implementing a variable FEC system in accordance with one embodiment.

FIG. 4 is a flowchart illustrating one example of a process for selecting and adjusting a variable FEC. For every wavelength, pre-FEC BER is measured at the receiver (step 40). The measurement may be averaged over a specified time interval (e.g., 1 ms). The FEC overhead is selected by finding the pre-FEC BER in the look-up table and identifying the FEC overhead which provides a desired post-FEC BER (step 42). A vFEC (variable FEC) mode status signaling byte (described below) is registered based on the selected FEC overhead. The FEC overhead is communicated to the transmitter with the signaling byte and transmitted to the corresponding (transmitting) optical node (step 44). In the typical case of bi-directional links, the receiver reads the FEC overhead used in the opposite link direction (step 46). The system determines if the FEC overhead is the same for both directions (step 48). If the FEC overhead selected by both nodes is the same, the FEC overhead is set at the selected level (step 50). If the FEC overhead values are different, the receiver defaults to the highest overhead selected by the two nodes (step 52). In an alternative embodiment, the receiver may provision for asymmetric FEC overhead. The set-up procedure is then completed and the status is changed to operational.

A variable FEC mode status byte signaling mechanism is used to register a status byte and signal the selected EC overhead. In one embodiment, a 1-byte register is used, as follows:

001→GFEC
111→25% FEC-OH
000→no FEC.

The byte determines the mode-status (payload size (frame delineation), payload-rate→I/O speed (e.g., SFI I/O speed is payload rate/16)). In one embodiment, one of the unused OTU overhead bytes is used for the mode status byte. For example, the row 1, column 14 byte (last RES OTU byte) of the OTU overhead may be used.

After variable FEC mode has been established, the pre-FEC is monitored and the margin may be tracked and reported. In one embodiment, the mode is not changed after implementation. In another embodiment, the mode may be changed to account for long-term effects (e.g., fiber aging). This may be useful if many variable FEC levels are available.

Figure 5:
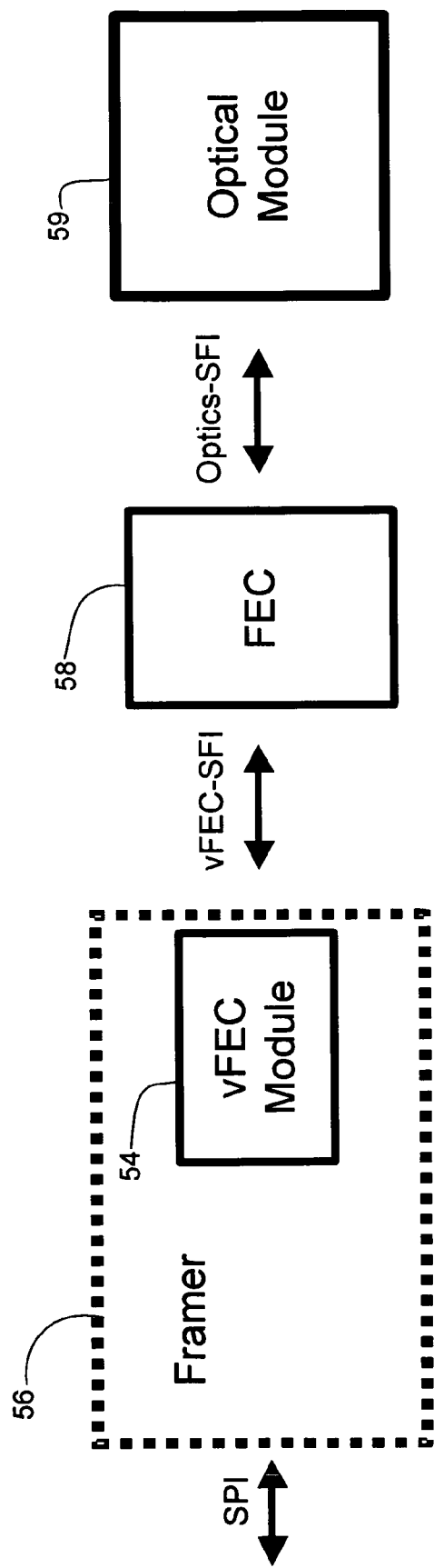
FIG. 5 is a block diagram illustrating one embodiment of the variable FEC system.

One example of a variable FEC system is shown in FIG. 5. A variable FEC (vFEC) module 54 is provided as part of a framer 56 and can accommodate the variable payload rate by controlling the PLL (phase-locked loop) of a clock for a vFEC-SFI (serializer/deserializer (SerDes) framer interface) between vFEC 54 and FEC 58 to:

vFEC-SFI-rate=vFEC–payload rate/16

An optics-SFI interface is provided between the FEC block 58 and optical module 59. The framer 56 also includes a SPI (system packet interface). The vFEC module 54 may also be used to implement a FIFO in which the threshold implements the flow control. The FIFO is important if used with a fixed frequency MAC/Framer.

Figure 6:
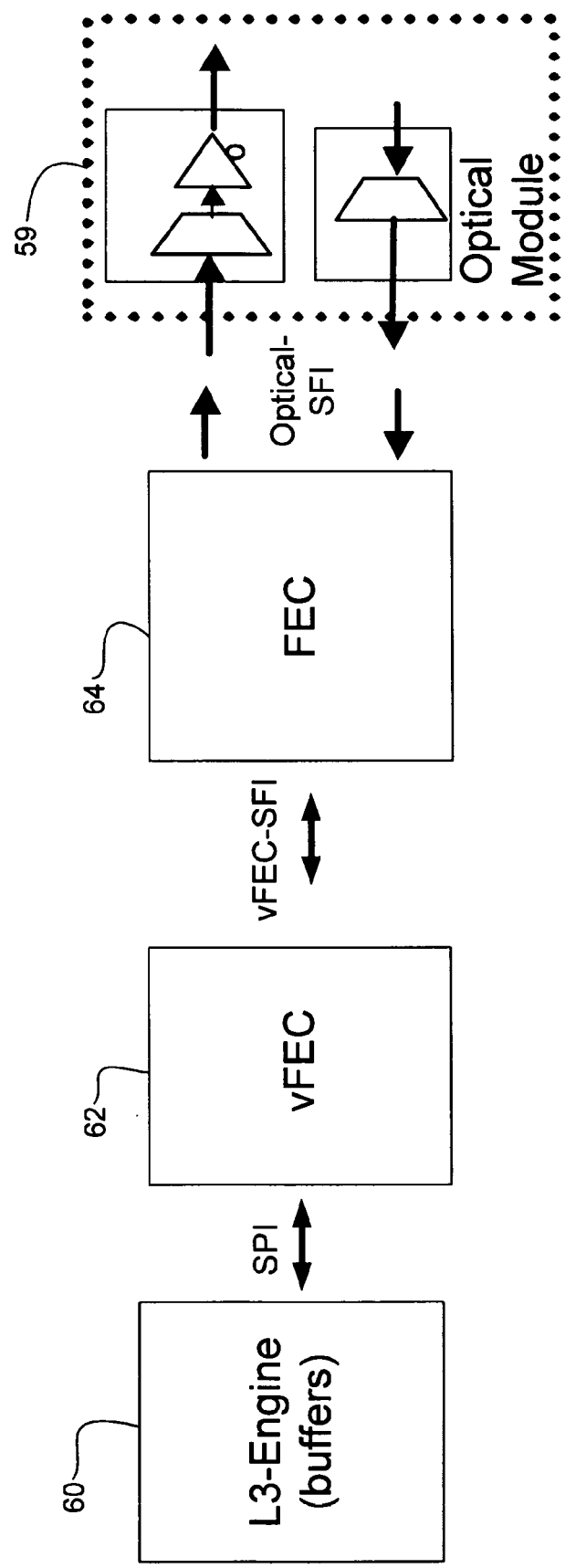
FIG. 6 is a block diagram illustrating one embodiment of the variable FEC system with an external FEC.

FIG. 6 illustrates such a variable FEC system embodiment with an external FEC 64. An ASIC (or FPGA) 62 may be used to provide encapsulation (e.g., MAC/PoS functions) and vFEC functions. The ASIC or FPGA 62 interfaces with the FEC 64 at a vFEC-SFI interface and with an L3-engine 60 at a SPI interface. The L3-engine 60 is a transmit/receive link layer device.

Figure 7:
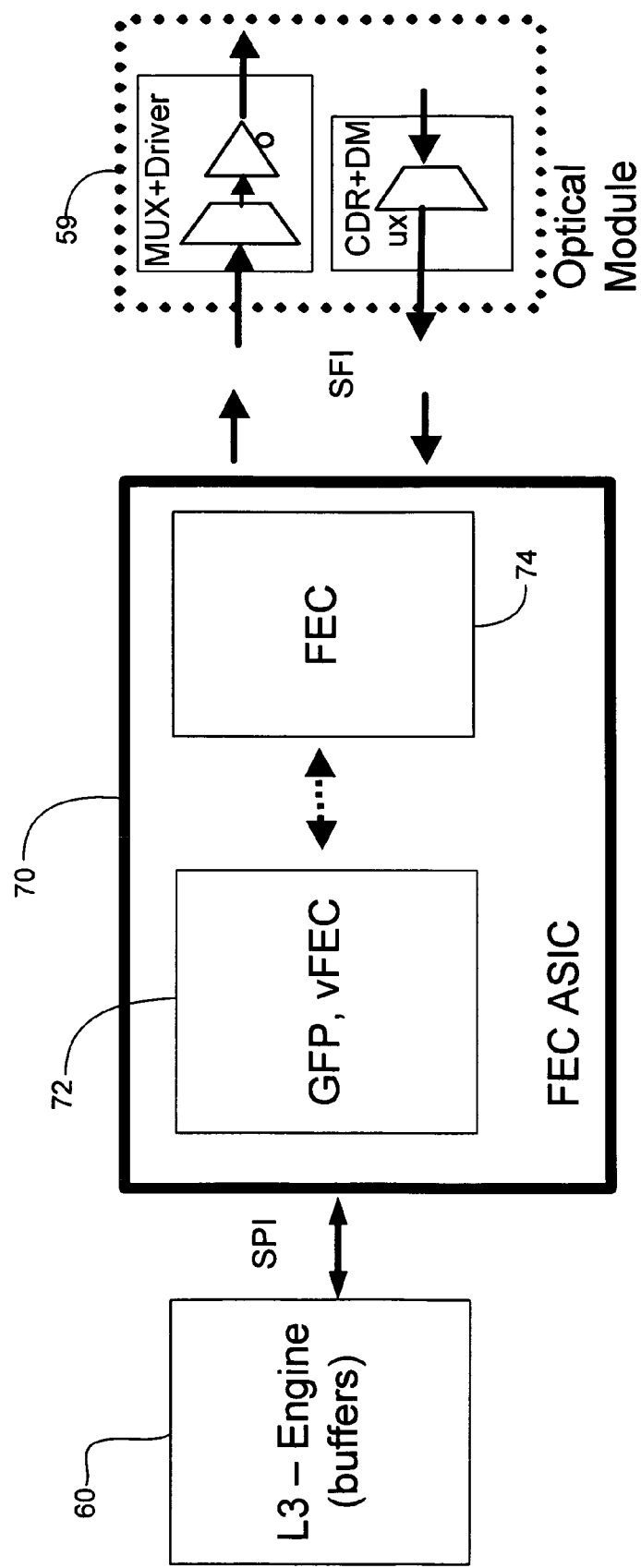
FIG. 7 is a block diagram illustrating one embodiment of the variable FEC system with an integrated FEC.

FIG. 7 illustrates an alternative embodiment for the variable FEC system. The encapsulation and vFEC 72 are combined with the FEC 74 in a single chip 70 (e.g., ASIC or FPGA for 10 Gb/s, ASIC for 40 Gb/s). The integrated design provides lower overhead and total power.

As can be observed from the foregoing, the method and system described herein provide many advantages. For example, the method and system enable optimization of the amount of FEC overhead and data payload employed at each optical link, thus minimizing the expensive optical-electrical-optical (OEO) conversion (or regeneration) in optical transport systems. Furthermore, since the system is implemented in electronics, the cost is relatively low. The fixed line rate embodiment allows for implementation in conventional optical fiber communication systems.

Although the method and system have been described in accordance with the embodiments shown, one of ordinary skill in the art will readily recognize that there could be variations made to the embodiments without departing from the scope of the present invention. Accordingly, it is intended that all matter contained in the above description and shown in the accompanying drawings shall be interpreted as illustrative and not in a limiting sense.

What is claimed is:

1. A method for setting a variable forward error correction overhead in an optical transport network frame for an optical link at a first node, comprising:
   selecting a forward error correction overhead at the first node;
   signaling an optical node said selected forward error correction overhead;
   receiving a forward error correction overhead selected by the optical node and comparing it to said forward error correction overhead selected at the first node; and
   setting said forward error correction overhead in the optical network transport frame for use in transmission of data over the optical link.

2. The method of claim 1 wherein selecting a forward error correction overhead comprises measuring a bit error rate of the optical link prior to applying forward error correction.

3. The method of claim 1 wherein selecting a forward error correction overhead comprises measuring a characteristic of the optical link and performing a look-up for a forward error correction overhead in a table based on a desired characteristic of the optical link.

4. The method of claim 1 further comprising adjusting the payload area of the optical transport network frame based on said selected forward error correction overhead to maintain a constant line rate at the first node.

5. The method of claim 1 wherein selecting comprises adjusting said forward error correction overhead to meet optical signal to noise ratio performance requirements.

6. The method of claim 1 wherein said improved system performance comprises improved transmission distance or optical signal to noise ratio performance.

7. The method of claim 1 wherein selecting a forward error correction overhead comprises looking up said forward error correction overhead in a table comprising bit error rates prior to forward error correction and bit error rates after forward error correction based on different forward error correction overheads.

8. The method of claim 1 further comprising replacing said selected forward error correction overhead with said received forward error correction overhead if said received forward error correction overhead is higher than said selected forward error correction overhead.

9. An apparatus for setting a variable forward error correction overhead in an optical transport network frame for an optical link, comprising:
   a variable forward error correction device configured to select a forward error correction overhead for use in transmission of data over the optical link; and
   a transmitter operable to signal an optical node said selected forward error correction overhead;
   wherein the variable forward error correction device is further configured to select said forward error correction overhead from a list of forward error correction overheads each having an associated minimum bit error rate prior to forward error correction and an associated maximum bit error rate after forward error correction.

10. The apparatus of claim 9 further comprising a look-up table for use in selecting said forward error correction overhead.

11. The apparatus of claim 9 wherein the variable forward error correction device is configured to adjust the payload area of the frame.

12. The apparatus of claim 11 wherein the payload area of the frame is based on said Selected forward error correction overhead to maintain a constant line rate.

13. The apparatus of claim 9 wherein said forward error correction overhead is selected to provide improved system performance.

14. The apparatus of claim 9 wherein the variable forward error correction device is configured to dynamically update the forward error correction overhead.

15. An apparatus for setting a variable forward error correction overhead in an optical transport network frame for an optical link at a node, comprising:
   means for selecting a forward error correction overhead;
   means for signaling an optical node said selected forward error correction overhead;
   means for receiving a forward error correction overhead selected by the optical node and comparing it to said forward error correction overhead selected at the first node; and
   means for setting said forward error correction overhead in said optical network transport frame for use in transmission of data over the optical link.

16. The apparatus of claim 15 further comprising means for measuring a bit error rate of the optical link.

17. The apparatus of claim 15 further comprising means for adjusting the payload area of the frame based on said selected forward error correction overhead to maintain a constant line rate.

18. The apparatus of claim 15 wherein said forward error correction overhead is selected based on a bit error rate prior to forward error correction.

* * * * *